United States Patent
Hunger et al.

(10) Patent No.: US 6,306,225 B1
(45) Date of Patent: *Oct. 23, 2001

(54) PROCESS FOR PRODUCING WEAR-RESISTANT BORIDE LAYERS ON METALLIC MATERIAL SURFACES

(75) Inventors: Hans-Jorg Hunger, Kerpen; Gunter Lobig, Chemnitz; Gerhard Trute, Kerpen, all of (DE)

(73) Assignee: Bor Tec GmbH, Frechen-Grefrath (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/543,477

(22) Filed: Apr. 6, 2000

Related U.S. Application Data

(63) Continuation of application No. 09/117,204, filed as application No. PCT/EP97/00298 on Jan. 23, 1997, now abandoned.

(30) Foreign Application Priority Data

Jan. 25, 1996 (DE) ................................. 196 02 639

(51) Int. Cl.⁷ ........................................... C23C 16/38
(52) U.S. Cl. .................. 148/241; 148/279; 148/525; 148/712; 427/562; 427/569; 427/255.26; 427/255.4
(58) Field of Search .................... 148/241, 279, 148/525, 712; 427/562, 569, 255.26, 255.4

(56) References Cited

FOREIGN PATENT DOCUMENTS

269251 * 6/1988 (EP).
59-068821 * 4/1984 (JP).

OTHER PUBLICATIONS

Dearnley et al., Surface Engineering, vol. 1, No. 3, 1985, pp. 203–217. (no month).*

* cited by examiner

*Primary Examiner*—Timothy Meeks
(74) *Attorney, Agent, or Firm*—Darby & Darby

(57) ABSTRACT

A process is provided for producing wear-resistant boride layers on metal material surfaces. The process is characterized in that a boron halide selected from the group comprising boron trifluoride, boron tribromide, boron triiodide and their mixtures is mixed with hydrogen and optionally argon and/or nitrogen, in order to produce a reaction gas containing between 0.1 and 30 vol % boron halide. The resultant mixture is activated by a plasma discharge whereby boron is transferred from the plasma to the metal surface.

7 Claims, No Drawings

PROCESS FOR PRODUCING WEAR-RESISTANT BORIDE LAYERS ON METALLIC MATERIAL SURFACES

This is a continuation of application Ser. No. 09/117,204 filed Jul. 24, 1998 now abandoned in the name of Hans-Jörg HUNGER, et al. for PROCESS FOR PRODUCING WEAR-RESISTANT BORIDE LAYERS ON METALLIC MATERIAL SURFACES filed as application PCT/EP97/00298 filed Jan. 23, 1997.

BACKGROUND OF THE INVENTION

FIELD OF THE INVENTION

The invention relates to a process for producing wear-resistant boride layers on metallic material surfaces.

Wear-resistant boride layers are usually produced in practice using solid boriding agents, for example in the form of powders, pastes or granules.

A disadvantage of these processes is that they are labor-intensive in terms of packing, unpacking and cleaning the parts. Cleaning is carried out using a combination of washing and brushing or abrasive-blasting. Since the powders, pastes and granules can be used only once, problems also arise in disposing of the spent boriding agents.

In addition, the use of liquid boriding agents, for example in the form of salt melts, is also known. However, all these processes have not been able to become established owing to the problems generally associated with salt baths, viz. those relating to safety of handling, cleaning of the parts after treatment and disposal of the baths or their waste products.

In the past, there have been various attempts at boriding using gaseous boriding agents (CVD processes). When using organic boron compounds (trimethylboron, trialkylborons), carburization occurred predominantly instead of boriding; when diborane is used, safety problems occur because of the extreme toxicity and the risk of explosion.

The use of a boron trichloride as boron donor medium has not been able to become established because of process-inherent problems in layer formation. The cause of these problems is the hydrogen chloride formation which always occurs in boriding using $BCl_3/H_1$ mixtures.

In the boriding of ferrous materials using boron trichloride, the following fundamental reactions occur:

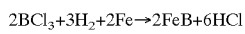

$$2BCl_3 + 3H_2 + 2Fe \rightarrow 2FeB + 6HCl$$

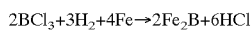

$$2BCl_3 + 3H_2 + 4Fe \rightarrow 2Fe_2B + 6HCl$$

The hydrogen chloride gas formed in boriding using $BCl_3$ reacts with the iron of the base material to form volatile iron chlorides:

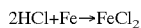

$$2HCl + Fe \rightarrow FeCl_2$$

The iron chlorides have high vapor pressures at the treatment temperatures in the range 500° C.–1200° C. which are employed, resulting in substantial, ongoing evaporation of iron chloride. This leads to hole formation between boride layer and substrate, as is always criticized in the case of the $BCl_3$ process. Suppression of the hole formation is only possible if one succeeds in generating an impermeable boride layer within a very short time at the beginning of boriding. This is technically difficult in that to the present time it cannot be achieved reliably and reproducibly.

Apart from the purely thermal variant of CVD boriding, work on plasma-aided boriding (PACVD boriding) is also known. Hitherto, only diborane and boron trichloride have been used in this process variant, accompanied by the disadvantages which are already known from thermal CVD. An overview of the processes mentioned may be found in the review "Engineering the Surface with Boron Based Materials", Surface Engineering 1985, Vol. 1, No. 3, pp. 203–217.

It is therefore an object of the invention to provide a process for producing wear-resistant boride layers on metallic materials, which process does not suffer from the above-mentioned disadvantages.

SUMMARY OF THE INVENTION

According to the invention, this object is achieved by a process which comprises mixing at least one boron halide selected from the group consisting of boron trifluoride, boron tribromide and boron triiodide as boron source with hydrogen and possibly argon and/or nitrogen to generate a reaction gas containing from 1 to 35% by volume of boron halide and activating the resulting mixture by means of a plasma discharge so as to enable boron to be transferred from the plasma to the metal surface.

DESCRIPTION OF THE PREFERRED EMBODIMENTS

The reaction gas can further comprise boron trichloride as boron source.

The reaction gas preferably contains from 5 to 20% by volume of boron halide, particularly preferably from 5 to 15% by volume of boron halide.

The reaction gas preferably contains from 20 to 90% by volume of $H_2$, particularly preferably from 20 to 50% by volume of $H_2$.

The reaction gas preferably comprises boron trifluoride.

Boron trifluoride is particularly preferably used as the boron halide.

The reaction gas is fed to the treatment space in an amount of preferably from 0.5 to 2 l per minute, particularly preferably about 1 l/min.

Boriding is preferably carried out in the pressure range of 1–10 mbar under the action of a plasma discharge as is known, for example, from plasma coating units. The plasma discharge can be pulsed or unpulsed.

The required treatment temperatures of preferably from 400° C. to 1200° C., particularly preferably from 850 to 950° C., are generated by the plasma itself or, especially in the high-temperature range above 900° C., with the aid of additional heating.

The treatment time is preferably from 30 to 240 min, particularly preferably from 30 to 120 min.

The thickness of the boride layers is usually controlled via the treatment time, with the thicknesses of the layers increasing with increasing treatment time.

As further gases, the reaction gas can additionally comprise argon and/or nitrogen. They enable the activity of boron transfer to be controlled and sufficient heating of the specimens by the plasma to be achieved. The composition of the reaction gas can thus vary within wide limits depending on the treatment conditions and the material to be borided.

The process of the invention is particularly suitable for boriding ferrous materials.

In the process of the invention, molecular hydrogen present in the reaction gas is converted into atomic hydrogen by means of a plasma discharge. The atomic hydrogen reduces the boron halide ($BY_3$) and thus enables boron to be transferred to the workpiece surface.

$$BY_3 + 3H \rightarrow B + 3HY$$

$$B + x\ ME \rightarrow Me_xB$$

However, conversion of $BY_3$ into $BY_2$ by the plasma can also occur, in which case the following reactions can then proceed:

$$3BY_2 \rightarrow B + 2BY_3$$

$$B + x\ ME \rightarrow Me_xB$$

Subsequent to boriding, the borided material can be subjected to an aftertreatment to convert any FeB formed into $Fe_2B$. This can be achieved, for example, by a heat-treatment process subsequent to the boriding treatment by stopping the supply of boron halide and holding the workpiece at the treatment temperature for a further time. The duration of this diffusion treatment depends on the amount of FeB present and is usually 20–60 min.

The process can be carried out, for example, in a unit which is suitable for plasma coating and is known per se. This consists essentially of the following components:

The vacuum vessel (reactor) for accommodating the parts to be treated. The reactor should be heatable and allow operation in the temperature range from 400° C. to 1200° C.

The pumping system for evacuating the reactor and setting the working pressure.

The gas supply unit for mixing and metering in the reaction mixture.

The pulsed plasma power supply for generating and maintaining the plasma discharge in the vacuum vessel, such that the power introduced can be varied within a wide range by means of the pulse frequency or pulse width.

The system for neutralizing and disposing of the gas and the system for controlling and monitoring the operating parameters: the latter system controls and monitors the course of the process.

EXAMPLE 1

After introducing a 100Cr6 steel specimen into the reactor, it is heated in the plasma of a DC glow discharge having a constant pulse frequency (4 kHz) at a pressure of 10 mbar. The specimen is additionally heated by means of the heating of the reactor, thereby shortening the heating time. The heating and cooling of the specimen is carried out in a 1:1 mixture of argon and hydrogen. After the treatment temperature of 850° C. is reached, the boron source boron trifluoride is added at such a rate that a reaction gas mixture composed of 45% by volume of hydrogen, 40% by volume of argon and 15% by volume of boron trifluoride is formed. The gas mixture is fed to the vessel in an amount of 1 l/min. The duration of the plasma treatment is 200 min.

A metallographic section shows a boride layer having a mean thickness of 42 μm. The microhardness is 1800 $HV_{0.05}$. The layer is free of FeB.

EXAMPLE 2

After introducing a Hastelloy B specimen into the reactor, it is heated in the plasma of a DC glow discharge, having a constant pulse frequency (4 kHz). The specimen is heated to a temperature of 850° C. by means of the plasma discharge at 10 mbar. The power density is controlled via the pulse width. The specimen is heated exclusively by means of the glow discharge. The heating and cooling of the specimen is carried out in a 1:1 mixture of argon and hydrogen. After the treatment temperature is reached, the boron source boron trifluoride is added in such an amount that a reaction mixture composed of 45% by volume of hydrogen, 45% by volume of argon and 10% by volume of boron trifluoride is formed. The gas mixture is fed to the vessel in an amount of 1 l/min. The treatment time is 240 min.

A metallographic section shows a boride layer having a mean thickness of 50 μm.

The micro hardness is 2400 $HV_{0.05}$.

What is claimed is:

1. A process for producing wear-resistant boride layers on a ferrous material surface which comprises (a) mixing boron triflouride as the boron source with hydrogen and optionally, argon, to generate a reaction gas containing from 1 to 35% by volume of boron triflouride, (b) in the resulting gas, converting the hydrogen into atomic hydrogen in the pressure range of 1–10 mbar by means of a pulsed plasma discharge so that the atomic hydrogen reduces the boron triflouride, (c) contacting the ferrous material surface, in a treatment space, with the reaction gas containing the converted hydrogen, and (d) converting FeB on the ferrous material surface to $Fe_2B$.

2. The process as claimed in claim 1, wherein the reaction gas contains 20–90% by volume of $H_2$.

3. The process as claimed in claim 1, wherein the reaction gas is fed into the treatment space in an amount of from 0.5 to 2 liters per minute.

4. The process as claimed in claim 1 carried out at temperatures of from 850° C. to 950° C.

5. The process as claimed in claim 1, which is carried out for from 30 to 240 minutes.

6. The process of claim 1, wherein step (d) comprises heating the ferrous material surface.

7. The process of claim 6, wherein the ferrous material surface is heated for from 20 to 60 minutes.

* * * * *